PRINTED CIRCUIT BOARD CONNECTOR

Filed March 26, 1963 2 Sheets-Sheet 1

INVENTOR
JOHANNES BERNUTZ
BY
ATTORNEY

PRINTED CIRCUIT BOARD CONNECTOR

Filed March 26, 1963 2 Sheets-Sheet 2

INVENTOR
JOHANNES BERNUTZ

BY [signature]
ATTORNEY

United States Patent Office 3,264,596 Patented August 2, 1966

3,264,596
PRINTED CIRCUIT BOARD CONNECTOR
Johannes Bernutz, Ludwigsburg-Hoheneck, Germany, assignor to International Standard Electric Corporation
Filed Mar. 26, 1963, Ser. No. 268,018
Claims priority, application Germany, Apr. 7, 1962, St 14,581
1 Claim. (Cl. 339—17)

This invention relates to connectors generally and more particularly to printed circuit board connectors.

An object of this invention is to provide simplified printed circuit board connectors. Here an object is to provide inexpensive, easily manufactured parts having standard dimensoins. Thus, an object of the invention is to reduce the over-all costs of printed circuit board construction.

In accordance with one aspect of this invention, a connector is formed from a strip of insulation material having a layer of conductive material deposited on each side thereof. By use of printed circuit manufacturing techniques, the undesired portions of the conductive material are removed from the strip. The material remaining after such removal is distributed along the length of the strip to provide a series of electrical contact points. Next, the strip is fastened to the printed circuit board. Then an electrical connection is made from each contact point to the printed circuit board.

The above-mentioned and other features of this invention and the manner of obtaining them will become more apparent, and the invention itself will be best understood by reference to the following description of an embodiment of the invention taken in conjunction with the accompanying drawings, in which:

FIGS. 2–8 show various species of connector strip to printed circuit board attachments.

Figure 1:
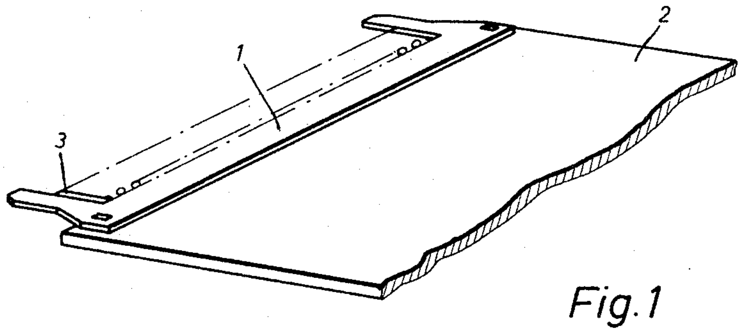
FIG. 1 is a perspective view of a connector strip attached to a broken-away section of a printed circuit card.

The printed circuit connector strip 1 (FIG. 1) is shown as attached, in any suitable manner, to a printed circuit board 2. Preferably the strip 1 is made of insulating material similar to the insulation material used to make the printed circuit boards. Initially the board from which strip 1 is cut or stamped has conductive material deposited on each side. Then, by a photo-etch, or other suitable process, the conductive material is removed to provide a plurality of separate contact members distributed in spaced parallel relation along the length of the strip. One such contact member is shown at 3.

The nature of the contact members 3 and their supporting insulating material 1 may become more apparent from a study of FIGS. 2–8, each of which is a cross sectional view of the strip 1 and a fragment of the printed circuit board 2.

Figure 2:
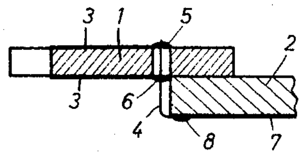

In FIG. 2, the two contact members 3 are shown facing each other, in parallel opposed relation, on opposite sides of the strip 1. A hole pierces the strip 1 and both of the oppositely disposed contact members 3. A ribbon or wire 4 runs through the hole and is soldered to the contact members 3, 3 (at 5 and 6) and (at 8) to a strip line 7 on the printed circuit board. The arrangement provides twin contacts 3, 3 to increase connector reliability. Thus, the strip line 7 is electrically connected to both of the contact members 3.

Figures 3A, 3B, 3C:
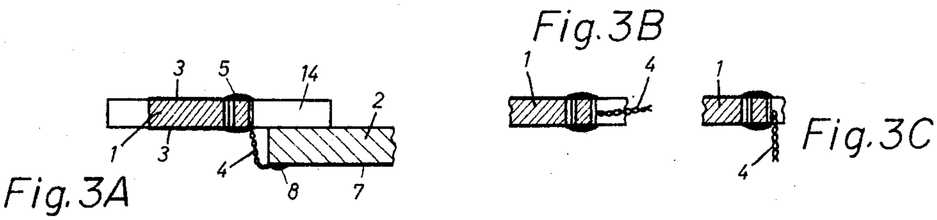

In FIG. 3A a slot 14 is formed in the strip 1 adjacent each contact member 3. The ribbon or wire 4 may be threaded through the hole that pierces the strip 1 and contact members 3. Then, if the strip line 7 is on the bottom of the printed circuit board 2, the end of the ribbon or wire 4 may be brought downward through slot 14 to the bottom of the board. If the strip line 7 is on the top of the board, the end of ribbon or wire 4 may be lifted into slot 14. Either way the end of the ribbon or wire 4 is soldered to the strip line 7. In FIGS. 3A, 3B and 3C, the strip to printed circuit board connection is made by a wire inserted through the hole, twisted to secure it in place, and then soldered into position.

Figures 4A, 4B, 5:
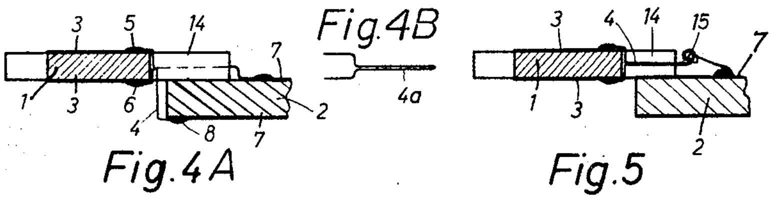

FIG. 4A shows how the contact member 3 may be soldered to the upper and lower strip lines 7. If upper and lower conductors are separated this doubles the number of contact members on strip 1. In FIG. 4B a preformed ribbon 4*a* is adapted to make one connection from both sides of the strip 1 to one side of the printed circuit board. FIG. 5 shows an alternative preformed wire or ribbon having an eyelet 15 on its end. This facilitates a connection between a wire and a contact member 3. Thus, for example, it may sometimes be convenient to attach one pig-tail connector to eyelet 15 and another pig-tail connector to the strip line 7.

Figure 6:
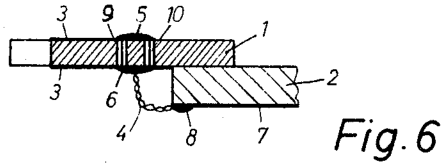

In FIG. 6, reliability is increased by providing a pair of holes 9, 10 in strip 1. A wire passes up through hole 9, over the top of strip 1, and back through hole 10. Then the two ends of the wire are twisted together. Finally, the wire is soldered into position at 5, 6 and 8.

Figure 7:
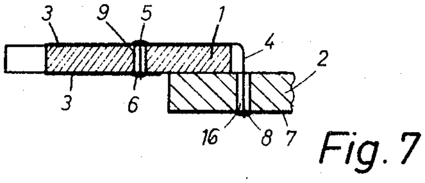

In FIG. 7, the printed circuit board 2 is pierced at 16 to receive the wire or ribbon 4. There the wire 4 passes through the board 2 before it is soldered into position at 8. This adds mechanical strength to wire 4.

Figure 8:
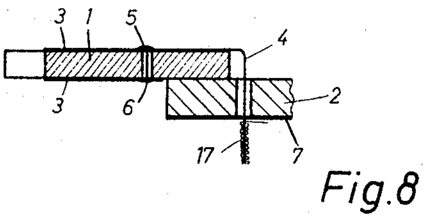

In FIG. 8, the printed circuit board 2 has a wire-wrap terminal attached thereto as shown at 17.

Figures 9A, 9B:
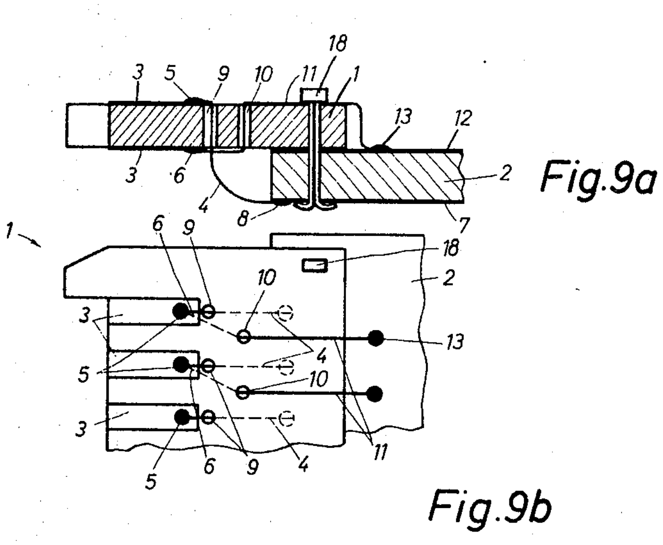
FIGS. 9A and 9B are a cross section and a plan view showing how contact members on opposite sides of the connector strip may be joined electrically.

FIG. 9A shows a cross-section view and FIG. 9B shows a top plan view of the strip 1 attached to the printed circuit card 2. Here the attachment of the strip to the board is accomplished by means of a rivet 18. Three of the spaced parallel contact members 3 are shown. Here, the wires 4 connect from the top of the strip 1 through the hole 9 to the bottom of board 2. A wire 11 connects from the bottom of the strip 1 through the hole 10 to the top of the board 2. Thus, both of the wires 4, 11 are given a mechanical support.

While the principles of the invention have been described above in connection with specific apparatus and applications, it is to be understood that this description is made only by way of example and not as a limitation on the scope of the invention.

I claim:

A printed circuit board connector comprising an elongated strip of insulating material for attachment to a printed circuit board, a plurality of spaced contact members distributed along the length of said strip on each side thereof, said spaced contact members consisting of metal deposits on said insulating material, each of said metal deposits being electrically insulated from the others, a plurality of electrical conductors, a plurality of openings through said strip to permit access by the electrical conductors from one side of the strip to the other, said openings serving as means to give mechanical support for conductors passing therethrough, a two sided printed circuit board having conductive portions on each side, means fastening said elongated strip to said printed circuit board to thereby hold a first side of the elongated strip in position against a first side of the printed circuit board, a first electrical conductor extending through one of said openings and being connected at one end to a first one of said metal deposits on the first side of said strip and being connected at the other end to a conductive portion on the first side of the printed circuit board, a second electrical conductor extending through one of said openings and being connected at one end to one of said metal deposits on a second side of said strip and at the other end to a conductive portion on the second side of said printed circuit board.

References Cited by the Examiner

UNITED STATES PATENTS

| | | | |
|---|---|---|---|
| 2,932,810 | 4/1960 | Novak | 339—17 |
| 2,993,187 | 7/1961 | Bisbing et al. | 339—17 |
| 3,020,510 | 2/1962 | Kuch | 339—17 |
| 3,061,911 | 11/1962 | Baker. | |
| 3,069,753 | 12/1962 | Lalmond et al. | 339—17 X |
| 3,107,414 | 10/1963 | Sterling. | |

FOREIGN PATENTS

| | | |
|---|---|---|
| 913,092 | 12/1962 | Great Britain. |

EDWARD C. ALLEN, *Primary Examiner.*

JOSEPH D. SEERS, ALFRED S. TRASK, *Assistant Examiners.*